US 6,700,782 B1

(12) United States Patent
Bopp et al.

(10) Patent No.: US 6,700,782 B1
(45) Date of Patent: Mar. 2, 2004

(54) APPARATUS AND METHOD TO RETAIN AN ELECTRONIC COMPONENT IN A PRECISE POSITION DURING ASSEMBLY MANUFACTURING

(75) Inventors: Timothy F. Bopp, Mesa, AZ (US); Kyle W. Kippes, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 10/306,355

(22) Filed: Nov. 27, 2002

(51) Int. Cl.[7] .................................................. H05K 7/20
(52) U.S. Cl. ........................ 361/704; 361/719; 361/709; 361/710; 257/718; 257/727; 24/453; 24/458
(58) Field of Search ................................. 361/703, 704, 361/707, 710, 719, 720, 717, 718, 760, 807; 257/718, 717; 24/453, 458

(56) References Cited

U.S. PATENT DOCUMENTS

| 5,065,279 | A | * | 11/1991 | Lazenby et al. | ............ 361/270 |
| 5,088,190 | A | * | 2/1992 | Malhi et al. | .................. 29/843 |
| 5,307,236 | A | * | 4/1994 | Rio et al. | .................. 361/720 |
| 5,570,271 | A | * | 10/1996 | Lavochkin | ................... 261/704 |
| 5,991,155 | A | * | 11/1999 | Kobayashi et al. | ......... 361/705 |
| 6,034,874 | A | * | 3/2000 | Watanabe | .................... 361/704 |
| 6,134,112 | A | * | 10/2000 | LeCornu et al. | ............ 361/720 |
| 6,191,480 | B1 | * | 2/2001 | Kastberg et al. | ............ 257/727 |
| 6,219,238 | B1 | * | 4/2001 | Andros et al. | ............. 361/704 |
| 6,498,726 | B2 | * | 12/2002 | Fuller et al. | ................ 361/704 |

* cited by examiner

Primary Examiner—Boris Chervinsky
(74) Attorney, Agent, or Firm—Blakely, Sokoloff, Taylor & Zafman LLP

(57) ABSTRACT

A clip which can be used to retain a component assembly in a carrier during pick-and-place and thermal assembly operations is provided. The clip comprises an elongate bridgepiece having opposed ends; a pair of legs, each depending from one of the opposed ends of the bridgepiece, the legs being shaped in dimensions to mate with complementary apertures in the carrier to releasably lock the bridgepiece to the carrier at a fixed height therefrom; and a plurality of deformable formations on an underside of the bridgepiece in between the legs, the deformable formations being shaped, dimensioned, and positioned to deform when brought to bear against a component in the carrier in a manner that regularly inward forces are applied to the component along at least two intersecting axes, the forces being symmetrically distributed with respect to the component.

20 Claims, 4 Drawing Sheets

APPARATUS AND METHOD TO RETAIN AN ELECTRONIC COMPONENT IN A PRECISE POSITION DURING ASSEMBLY MANUFACTURING

FIELD OF THE INVENTION

This invention relates to component handling equipment. In particular, it relates to component handling equipment to handle components during electronic assembly. Even more particularly, the invention relates to a clip and a carrier for use during pick-and-place operations.

BACKGROUND

During electronic assembly, components such as central processing units (CPUs), heat spreaders, wave guides, interposers, and other such devices are required to be picked, brought together, transported, etc., during various stages of the assembly process.

To facilitate the handling of electronic components during electronic assembly, the components that require assembly, e.g., a CPU and a heat spreader, are picked by a pick-and-place machine and placed in a carrier, where the components are retained by a clip in a precise relative orientation. The components may then be subjected to various processes, e.g., adhesive and thermal solution cures.

It is important that the clip maintains the precise relative orientation of the components. As component sizes shrink, the precision and accuracy with which a clip is required to maintain the relative orientation of the component increases.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1A:
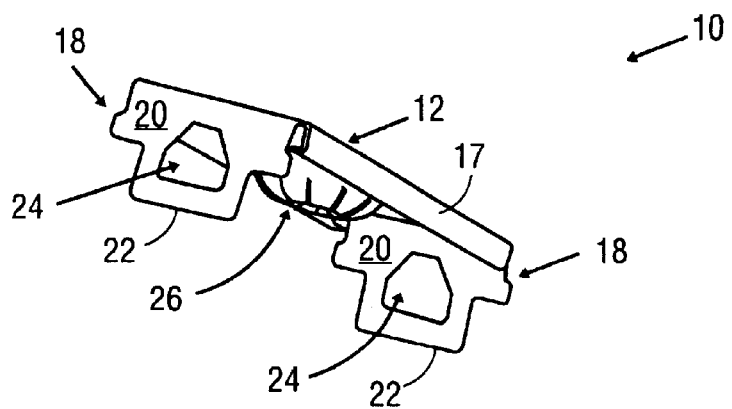
FIGS. 1A to 1C illustrate different views of a clip in accordance with one embodiment of the invention.
Figure 1B:
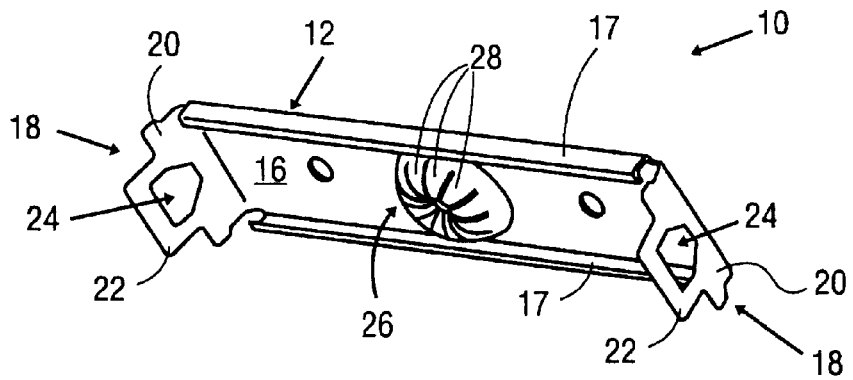
Figure 1C:
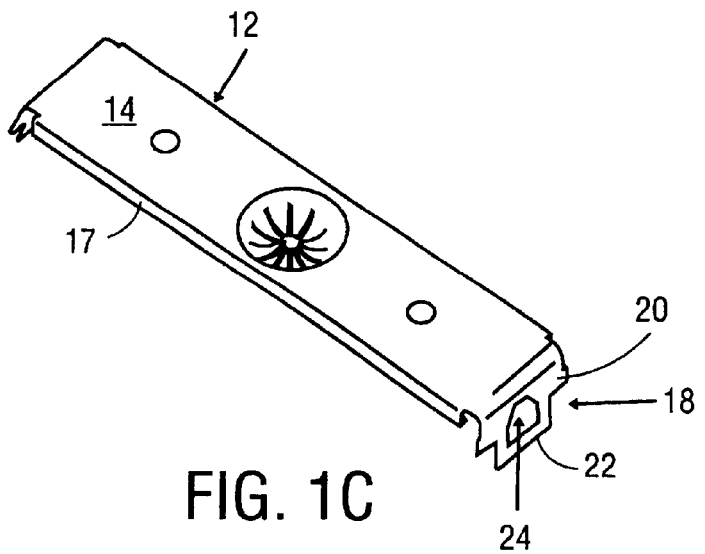

Referring now to FIGS. 1A to 1C of the drawings, reference numeral 10 generally indicates a clip in accordance with one embodiment of the invention. The clip 10 comprises an elongate bridgepiece 12 having an upper surface 14 (see FIG. 1C) and a lower surface 16 (see FIG. 1B). The bridgepiece 12 includes a channel formation 17 along its longitudinal edges. The purpose of the channel formation 17 is to impart strength or to stiffen the bridgepiece 12.

The clip 10 further comprises a pair of legs 18, each depending downwardly from an end of the bridgepiece 12. Each leg 18 comprises a wide upper portion 20 and a narrow lower portion 22. Further, each leg 18 comprises a recess 24 formed therein. The purpose of the narrow portion 22 and the recess 24 will be explained below.

A dome-shaped bearing member 26 is formed on the lower surface 16 of the bridgepiece 12. The bearing member comprises a plurality of curved fingers 28, each defining a deformable formation whose function will be explained below.

Figure 2:
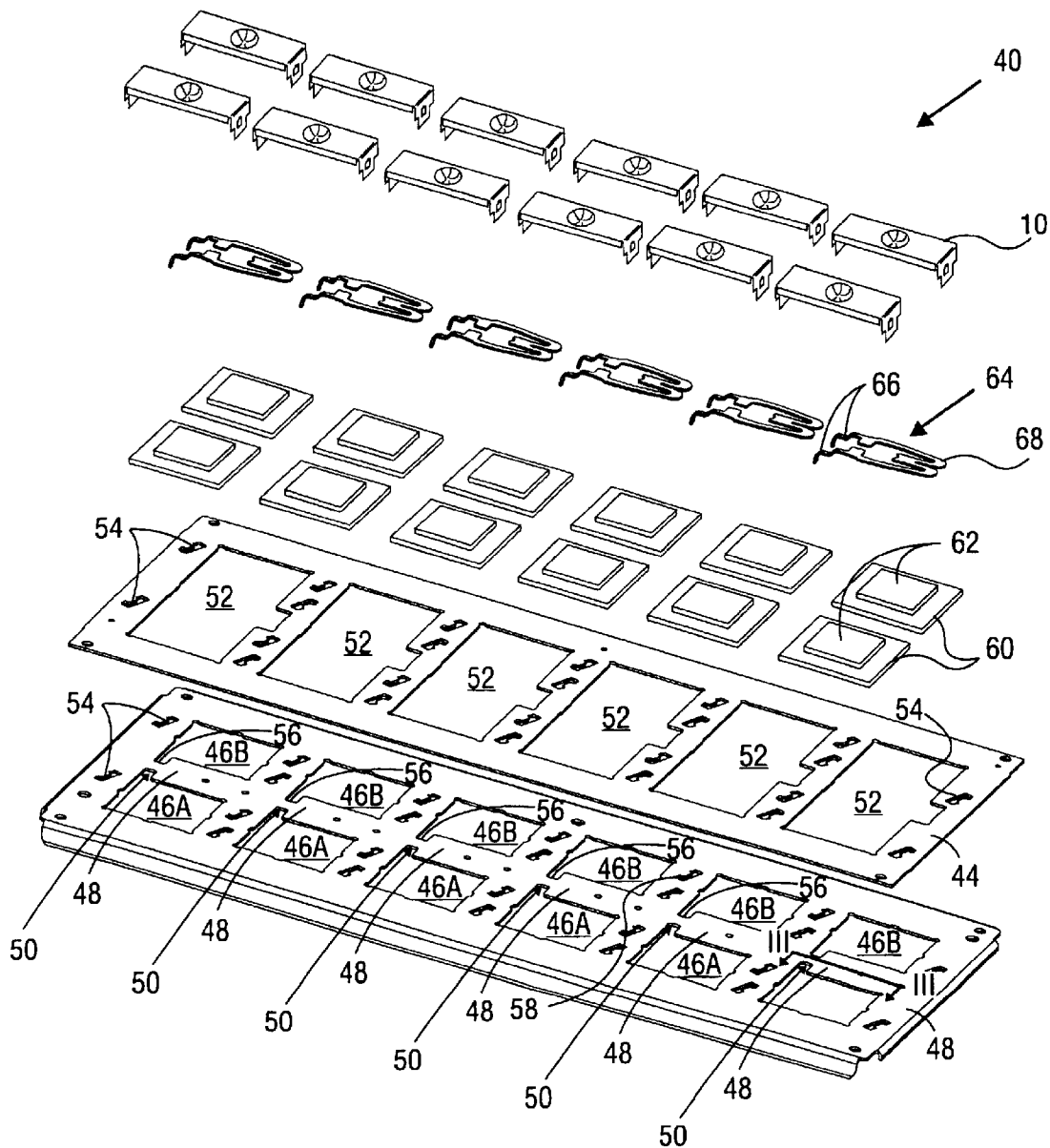
FIG. 2 shows a carrier and clip assembly in accordance with one embodiment of the invention.

Referring now to FIG. 2 of the drawings, reference number 40 generally indicates a clip and carrier assembly in accordance with one embodiment of the invention. The assembly 40 comprises a carrier which has a carrier body defined by a base plate 42 and a cover plate 44 which is welded thereto. The base plate 42 comprises a first row of recesses 46A, and a second row of recesses 46B formed therein. These rows of recesses are formed such that each recess 46A forms a pair of recesses in combination with a recess 46B and is separated therefrom by a portion of base plate 42 that is designated by reference to numeral 48. Each portion 48 has a recessed portion 50 whose function will be explained below.

It will be seen that the cover plate 44 comprises a plurality of recesses 52 formed therein, each recess 52 is shaped and dimensioned to straddle a corresponding pair of recesses 46A and 46B of the base plate 42. As described above, the cover plate 44 is, in use, welded to the base plate 42 so that each recess 52 of the cover plate 44, in combination with the a corresponding pair of recesses 46a and 46b of the base plate 42, defines a seat for a component assembly as will be explained. Each of the base plate 42 and the cover plate 44 have a plurality of retaining formations in the form of slots 54 whose function will be explained below.

The carrier and clip assembly 40 further comprises a plurality of component assemblies each comprising a first component 60 and a second component 62 which rests on the first component 60. The component assemblies may comprise further components. As an example of a component assembly, the first component 60 may be a central processing unit (CPU) and the second component 62 may be a component that needs to be attached to the CPU and may thus be a component such as a heat spreader. Each component assembly is located within a seat defined by the base plate 42 and cover plate 44.

Each component assembly is urged in a lateral direction away from portion 48 of the base plate 42 but by a biasing element 64 comprising a pair of legs 66 which are received in the recessed portions 50 of the base plate 42. Each biasing element 64 further comprises a body portion 68 which, in use, exerts an outward biasing force to urge a respective clip assembly laterally away from a portions 48 of the base plate 42.

The clip and carrier assembly further comprises a plurality of clips 10 to apply a downward clamping force on each carrier assembly to limit relative lateral movement between each second component 62 and first component 60 of a component assembly. Each leg 18 of a clip 10 engages the slots 54 in the base plate 42 and the cover plate 44, thereby to releasably lock the clip 10 to the carrier.

Figure 3:
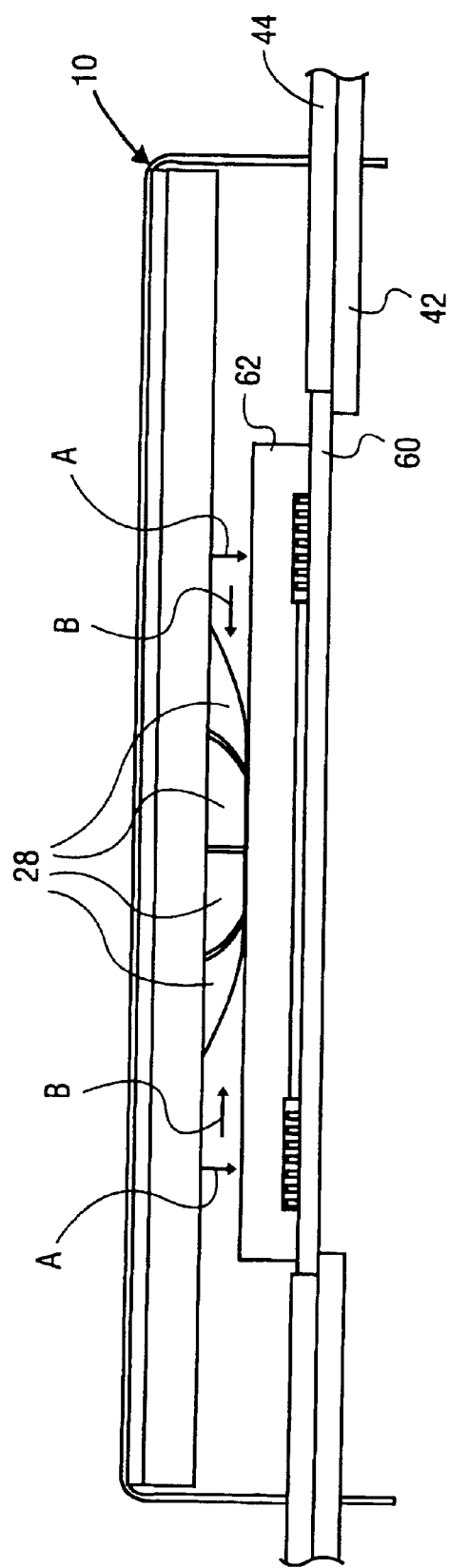
FIG. 3 shows a section through the carrier and clip assembly of FIG. 2 taken at III—III.
Figure 4:
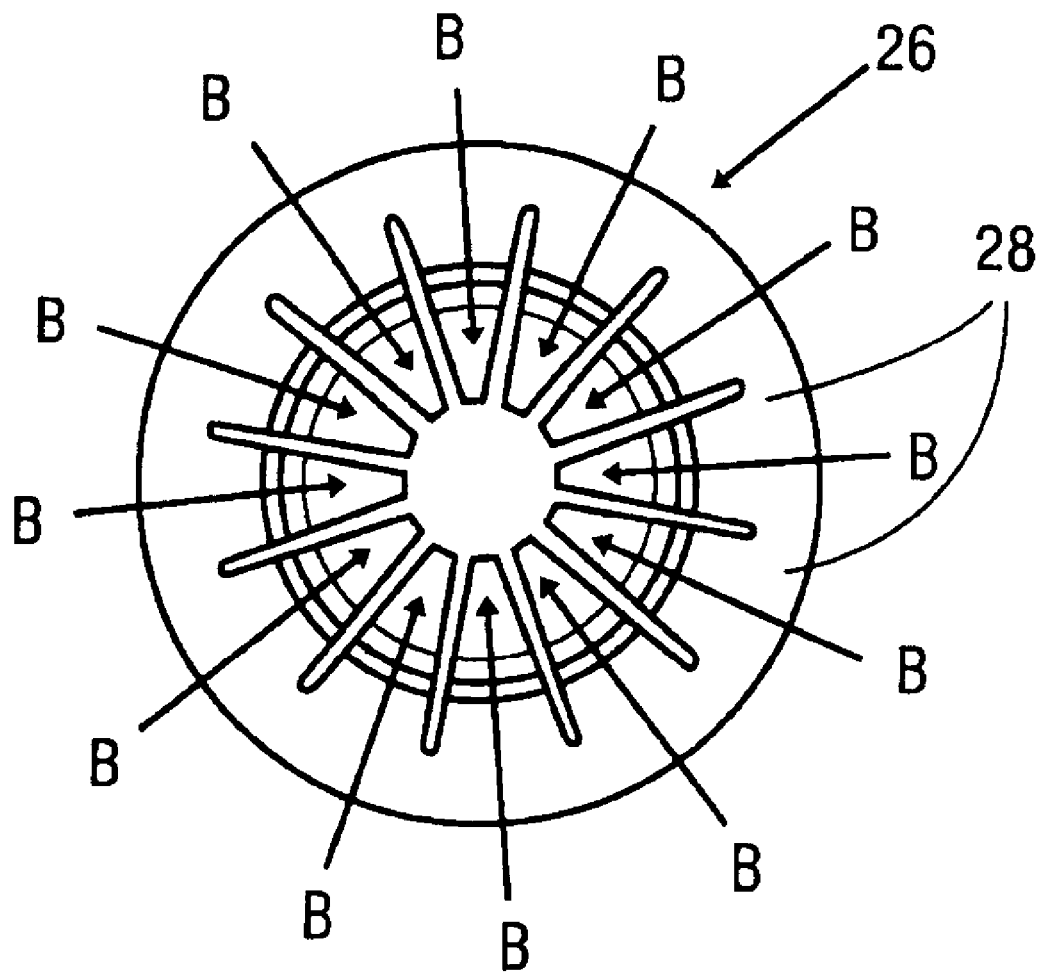
FIG. 4 shows a plan view of the dome-shaped bearing member of the clip of FIGS. 1A to 1C.

FIG. 3 shows a cross-section taken at III—III in FIG. 2. When a clip 10 is releaseably locked to the carrier the dome shaped bearing number 26 of the clip 10 bears against the second component 62 of a component assembly and is, as a result, under compression. Further, each finger 28 of the dome shaped bearing member 26 deforms radially inwardly so that in addition to a downward force depicted by arrows A in FIG. 3 of the drawings, there is also a radial force, indicated by arrows B in FIG. 3. In order to assist in the visualization of the radial forces indicated by arrows B in FIG. 3, FIG. 4A shows a plan view of the dome-shaped bearing number 26 where the radial forces B are clearly indicated. As can be seen, the radial forces B are symmetrically distributed with respect to the component 62 and thus tend to constrain lateral movement of the component 62 relative to the component 60.

The clip 10, in accordance with some embodiments of the invention, may be fabricated from a single metal blank by a metal stamping operation, and is thus fabricated as a single piece component. Naturally, the type of metal used, its gauge, the dimensions of the clip 10, and the depth to which the dome-shaped bearing member 26 is drawn will vary depending on the amount of radial and downward force that is required.

Existing clip designs for use with carriers as described, generally comprise multiple pieces and in addition to applying a downward force on a component assembly, a lateral force along a single axis in an x-y plane applied. Thus, each component 62 of a component assembly is constrained relative to the component 60 of the component assembly along only a single axis in an x-y plane. It will appreciated, that such a clip is undesireable since it does not prevent movement of component 62 relative to the component 60 of the component assembly along other axes in the x-y plane.

One advantage of the clip of the present invention is that the clip exerts radially inwardly extending forces which are symmetrically distributed about a component 62 thus tending to prevent movement of the component 62 to a component 60 along any axis in the x-y plane.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A clip, comprising:
   an elongate bridgepiece having opposed ends;
   a pair of legs, each depending from one of the opposed ends of the bridgepiece, the legs being shaped and dimensioned to mate with complementary apertures in a carrier to releasably lock the bridgepiece to the carrier at a fixed height therefrom; and
   a plurality of deformable formations on an underside of the bridgepiece in between the legs, the deformable formations being shaped, dimensioned, and positioned to deform when brought to bear against a component in the carrier in a manner that radially inward forces are applied to the component along at least two intersecting axes, the forces being symmetrically distributed with respect to the component.

2. The clip of claim 1, wherein the deformable formations comprise circumferentially spaced radially inwardly extending fingers.

3. The clip of claim 1, wherein the deformable formations are integrally formed with the bridgepiece.

4. The clip of claim 1, wherein the legs are integrally formed with the bridgepiece.

5. The clip of claim 1, wherein the bridgepiece, the legs, and the deformable formations are formed by a stamping operation performed on a metal blank.

6. The clip of claim 1, wherein the bridgepiece has stiffening formations.

7. The clip of claim 6, wherein the stiffening formations comprise a channel-shaped formation extending along a length of the bridgepiece on each side thereof.

8. A clip, comprising:
   an elongated bridgepiece having opposed ends;
   a pair of legs, each depending from one of the opposed ends of the bridgepiece; and
   a dome-shaped bearing member on an underside of the bridgepiece, in between the legs, the dome-shaped bearing member comprising a plurality of circumferentially spaced radially inwardly extending fingers to apply radially inward forces to a component in a carrier along at least two intersecting axes when the dome-shaped member is brought to bear against the component, the forces being symmetrically distributed with respect to the component.

9. The clip of claim 8, wherein the legs are shaped and dimensioned to engage complementary formations on the carrier to releasably lock with the carrier.

10. The clip of claim 8, wherein the dome-shaped bearing member is integrally formed with the bridgepiece.

11. The clip of claim 8, wherein the legs are integrally formed with the bridgepiece.

12. The clip of claim 8, wherein the bridgepiece has stiffening formations.

13. The clip of claim 12, wherein the stiffening formations comprise a channel-shaped formation extending along a length of the bridgepiece, on each side thereof.

14. A carrier and clip assembly, comprising:
   a carrier having a carrier body which includes a plurality of recesses defining seats shaped and dimensioned to seat at least one component therein, and clip retaining formations adjacent each recess;
   at least one component seated in one of the plurality of recesses;
   at least one clip comprising an elongated bridge with legs depending from each end thereof, the legs having mounting formations which releasably mate with the retaining formations adjacent the recess that has at least one component seated therein; and
   a plurality of resiliently deformable formations on an underside of the bridge which bear against the at least one component and apply forces thereto along at least two intersecting axes, which forces are symmetrically distributed with respect to the at least one component.

15. The carrier and clip assembly of claim 14, wherein the resiliently deformable formations comprise circumferentially spaced, radially inwardly extending fingers disposed to form a dome-shaped structure.

16. The clip and carrier assembly of claim 14, wherein the bridge, the legs, and the resilient deformably formations are integrally formed by a stamping operation performed on a metal blank.

17. A method, comprising:
   seating at least one component in a carrier;
   applying a first force to urge the at least one component into the carrier; and applying second forces along at least two intersecting axes to constrain a lateral movement of the at least one component relative to the carrier.

18. The method of claim 17, wherein applying the second forces comprises urging a clip towards the carrier to cause fingers of the clip arranged to form a dome to resiliently deform against the component.

19. A carrier and clip assembly, comprising:

a carrier having a carrier body which includes a plurality of recesses defining seats shaped and dimensioned to seat at least one electronic component therein, and clip retaining formations adjacent each recess;

at least one electronic component seated in one of the plurality of recesses;

at least one clip comprising an elongated bridge with legs depending from each end thereof, the legs having mounting formations which releasably mate with the retaining formations adjacent the recess that has at least one electronic component seated therein; and a plurality of resiliently deformable formations on an underside of the bridge which bear against the at least one electronic component and applied forces thereto along at least two intersecting axes, which forces are symmetrically distributed with respect to the at least one electronic component.

20. The carrier and clip assembly of claim 19, wherein the resiliently deformable formations comprise circumferentially spaced, radially inwardly extending fingers disposed to form a dome-shaped structure.

* * * * *